(12) United States Patent  
Chen et al.

(10) Patent No.: US 9,059,427 B2
(45) Date of Patent: Jun. 16, 2015

(54) DEVICE AND METHOD FOR TOP EMITTING AMOLED

(75) Inventors: Yu Cheng Chen, Hsinchu (TW); Shih Chang Chang, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 143 days.

(21) Appl. No.: 13/610,757

(22) Filed: Sep. 11, 2012

(65) Prior Publication Data

US 2014/0070236 A1 Mar. 13, 2014

(51) Int. Cl.
*H01L 29/18* (2006.01)
*H01L 51/52* (2006.01)
*H01L 27/32* (2006.01)

(52) U.S. Cl.
CPC ......... *H01L 51/5228* (2013.01); *H01L 27/3248* (2013.01); *H01L 2251/5315* (2013.01)

(58) Field of Classification Search
CPC .......... H01L 51/5228; H01L 27/3248

USPC ........................ 257/88; 438/26, 29
See application file for complete search history.

(56) References Cited

U.S. PATENT DOCUMENTS

| 7,086,917 | B2 | 8/2006 | Tao |
| 7,427,783 | B2 | 9/2008 | Lee et al. |
| 7,443,095 | B2 | 10/2008 | Kang |
| 7,687,802 | B2 * | 3/2010 | Kang et al. ............... 257/40 |
| 7,816,677 | B2 * | 10/2010 | Lee et al. ................. 257/40 |
| 2004/0180476 | A1 * | 9/2004 | Kazlas et al. ............ 438/146 |
| 2011/0057191 | A1 | 3/2011 | Murakami |

* cited by examiner

*Primary Examiner* — Nicholas Tobergte
(74) *Attorney, Agent, or Firm* — Fletcher Yoder PC

(57) ABSTRACT

Embodiments of the present disclosure relate to devices and methods for reducing the resistance level of top electrodes in top emission AMOLED displays. By way of example, one embodiment includes disposing a metal frame between the top electrode and an insulating layer. The present disclosure also relates to methods for making such a display in reduced number of process steps, including certain techniques for combining certain steps into one process step.

23 Claims, 6 Drawing Sheets

DEVICE AND METHOD FOR TOP EMITTING AMOLED

BACKGROUND

The present disclosure relates generally to displays and, more particularly, a top emission active matrix organic light emitting diode (AMOLED) having a top electrode with reduced resistance, such that brightness and uniformity of the display is improved.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic displays, such as AMOLED displays are commonly used in electronic devices such as televisions, computers, phones, tablets, and the like. A common form an AMOLED display is a top-emission AMOLED display, in which light emitted from organic electroluminescent material is transmitted directly through the top of the display via a transparent top electrode. Top emission AMOLED displays have certain advantages, such as having high pixel aperture ratios and high brightness levels. However, in certain large sized top emission AMOLED displays, the internal resistance level of the top electrode may be higher than desired. This may negatively impact display quality such as brightness and display uniformity.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the present disclosure relate to devices and methods for reducing the resistance level of top electrodes in top emission AMOLED displays. By way of example, one embodiment includes disposing a metal frame between the top electrode and an insulating layer. The metal frame may be conductively coupled to the top electrode. The increased conductive area may help decrease the internal resistance of the top electrode. The present disclosure also relates to methods for making such a display in a reduced number of process steps, including certain techniques for combining certain steps into one process step.

Various refinements of the features noted above may be made in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 5 is a flowchart of a manufacturing process for making the display of

FIG. 4, in accordance with aspects of the present disclosure;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, embodiments of the present disclosure relate to electronic displays, particularly top-emitting AMOLED displays, and electronic devices incorporating such displays which employ a device, method, or combination thereof for providing a simplified process and structure of the display. The result of which allows the display to be made in fewer steps, thereby streamlining the manufacturing process. Additionally, embodiments of the present disclosure include a metal frame conductively coupled to a top electrode, which reduces the resistance of the top electrode, improving the quality of display (e.g., brightness, uniformity).

Figure 1:
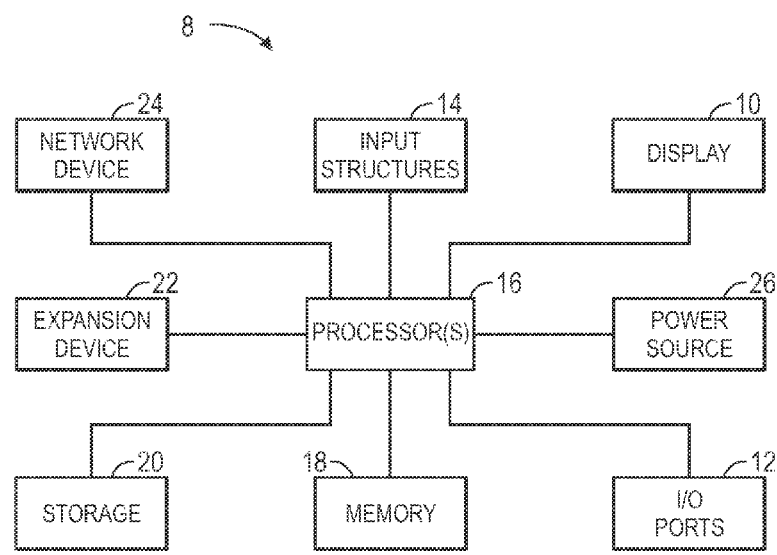
FIG. 1 is a block diagram of exemplary components of an electronic device, in accordance with aspects of the present disclosure.
Figure 3:
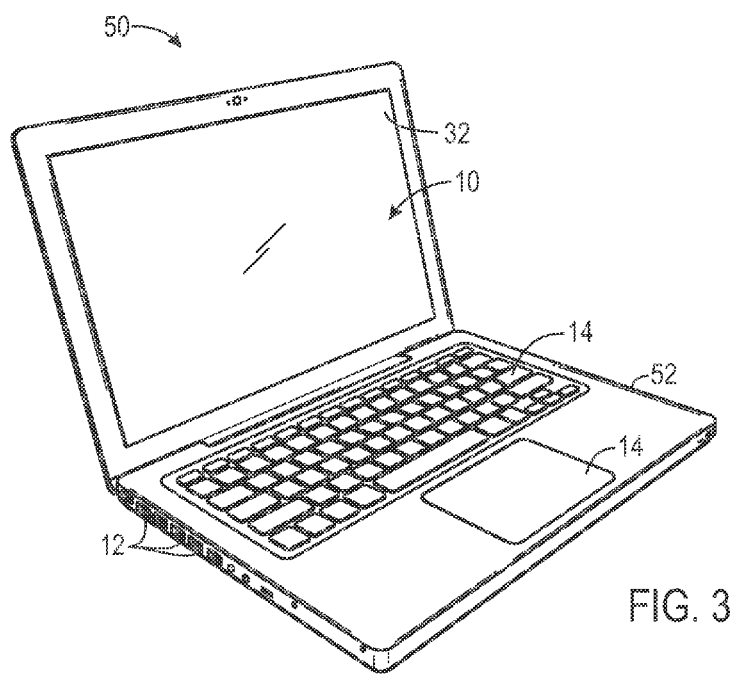
FIG. 3 is a view of a computer in accordance with aspects of the present disclosure.
Figure 2:
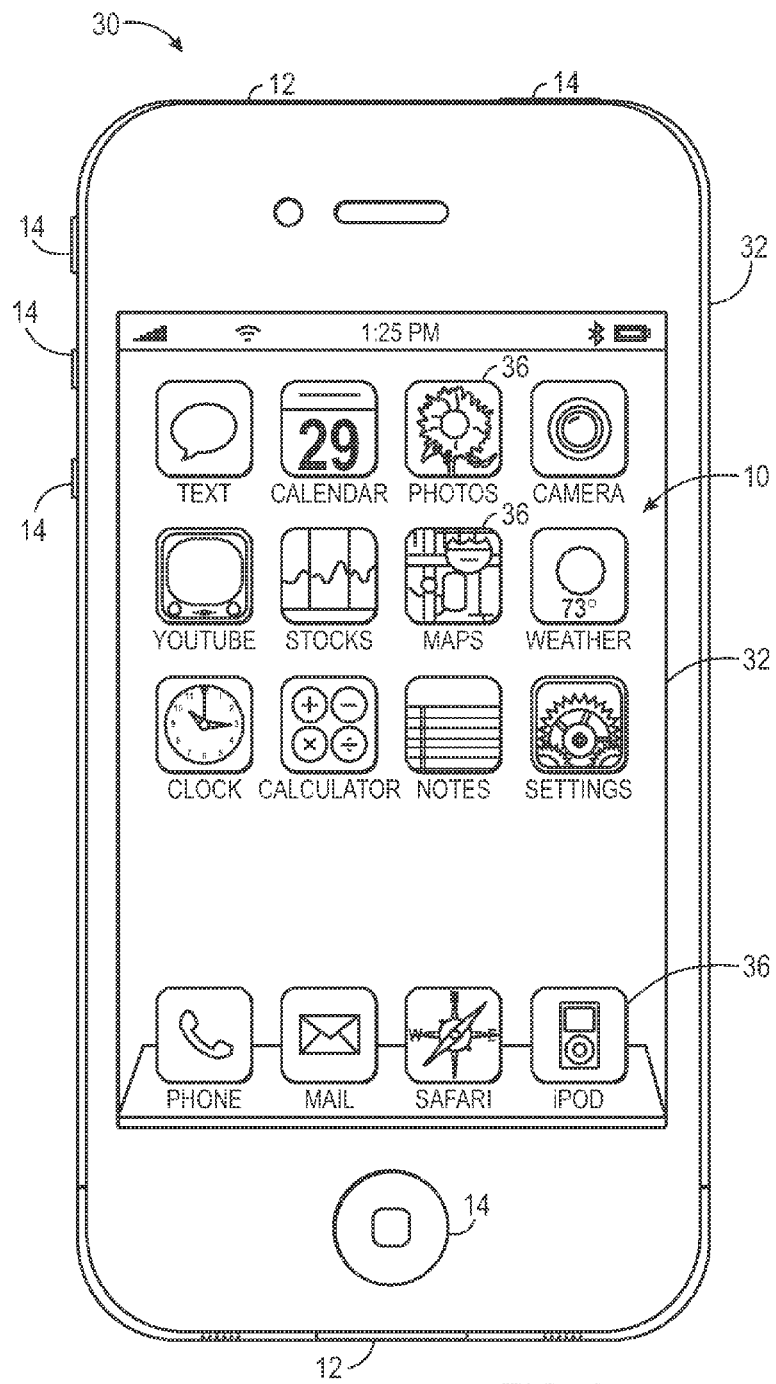
FIG. 2 is a front view of a handheld electronic device in accordance with aspects of the present disclosure.

With the foregoing in mind, a general description of suitable electronic devices that may employ electronic displays having top electrodes with decreased resistance is described below. In particular, FIG. 1 is a block diagram depicting various components that may be present in an electronic device suitable for use with such a display. FIGS. 2 and 3 respectively illustrate perspective and front views of a suitable electronic device, which may be, as illustrated, a notebook computer or a handheld electronic device.

FIG. 1 is a block diagram illustrating the components that may be present in such an electronic device 8 and which may allow the device 8 to function in accordance with the techniques discussed herein. Those of ordinary skill in the art will appreciate that the various functional blocks shown in FIG. 1 may comprise hardware elements (including circuitry), software elements (including computer code stored on a computer-readable medium) or a combination of both hardware and software elements. It should further be noted that FIG. 1 is merely one example of a particular implementation and is merely intended to illustrate the types of components that may be present in a device 8. For example, in the presently illustrated embodiment, these components may include a display 10, I/O ports 12, input structures 14, one or more processors 16, a memory device 18, a non-volatile storage 20, expansion card(s) 22, a networking device 24, and a power source 26. As will be appreciated, the overall quality of image data shown on the display 10 may be affected by the resistance of top electrodes of the display 10.

With regard to each of these components, the display 10 may be used to display various images generated by the device 8. In one embodiment, the display 10 may be an organic light emitting diode (OLED) display. Specifically, in certain embodiments, the display 10 may be an active matrix organic light emitting diode (AMOLED) display. Additionally, in certain embodiments of the electronic device 8, the display 10 may be provided in conjunction with a touch-sensitive element, such as a touch screen, that may be used as part of the control interface for the device 8.

The I/O ports 12 may include ports configured to connect to a variety of external devices, such as a power source, headset or headphones, or other electronic devices (e.g., such as handheld devices and/or computers, printers, projectors, external displays, modems, docking stations, and so forth). The I/O ports 12 may support any interface type, such as a universal serial bus (USB) port, a video port, a serial connection port, an IEEE-1394 port, an Ethernet or modem port, and/or an AC/DC power connection port.

The input structures 14 may include the various devices, circuitry, and pathways by which user input or feedback is provided to the processor 16. Such input structures 14 may be configured to control a function of the device 8, applications running on the device 8, and/or any interfaces or devices connected to or used by the electronic device 8. For example, the input structures 14 may allow a user to navigate a displayed user interface or application interface. Examples of the input structures 14 may include buttons, sliders, switches, control pads, keys, knobs, scroll wheels, keyboards, mice, touchpads, and so forth.

In certain embodiments, an input structure 14 and display 10 may be provided together, such as in the case of a touch-screen where a touch sensitive mechanism is provided in conjunction with the display 10. In such embodiments, the user may select or interact with displayed interface elements via the touch sensitive mechanism. In this way, the displayed interface may provide interactive functionality, allowing a user to navigate the displayed interface by touching the display 10.

User interaction with the input structures 14, such as to interact with a user or application interface displayed on the display 10, may generate electrical signals indicative of the user input. These input signals may be routed via suitable pathways, such as an input hub or bus, to the processor(s) 16 for further processing.

The processor(s) 16 may provide the processing capability to execute the operating system, programs, user and application interfaces, and any other functions of the electronic device 8. The processor(s) 16 may include one or more microprocessors, such as one or more "general-purpose" microprocessors, one or more special-purpose microprocessors and/or ASICS, or some combination of such processing components. For example, the processor 16 may include one or more reduced instruction set (RISC) processors, as well as graphics processors, video processors, audio processors, and/or related chip sets.

The instructions or data to be processed by the processor(s) 16 may be stored in a computer-readable medium, such as a memory 18. Such a memory 18 may be provided as a volatile memory, such as random access memory (RAM), and/or as a non-volatile memory, such as read-only memory (ROM). The memory 18 may store a variety of information and may be used for various purposes. For example, the memory 18 may store firmware for the electronic device 8 (e.g., such as a basic input/output instruction or operating system instructions), various programs, applications, or routines executed on the electronic device 8, user interface functions, processor functions, and so forth. In addition, the memory 18 may be used for buffering or caching during operation of the electronic device 8.

The components may further include other forms of computer-readable media, such as a non-volatile storage 20, for persistent storage of data and/or instructions. The non-volatile storage 20 may include flash memory, a hard drive, or any other optical, magnetic, and/or solid-state storage media. The non-volatile storage 20 may be used to store firmware, data files, software, wireless connection information, and any other suitable data.

The embodiment illustrated in FIG. 1 may also include one or more card or expansion slots. The card slots may be configured to receive an expansion card 22 that may be used to add functionality, such as additional memory, I/O functionality, or networking capability, to the electronic device 8. Such an expansion card 22 may connect to the device through any type of suitable connector, and may be accessed internally or external to the housing of the electronic device 8. For example, in one embodiment, the expansion card 22 may be a flash memory card, such as a SecureDigital (SD) card, mini- or microSD, CompactFlash card, Multimedia card (MMC), or the like.

The components depicted in FIG. 1 also include a network device 24, such as a network controller or a network interface card (NIC). In one embodiment, the network device 24 may be a wireless NIC providing wireless connectivity over any 802.11 standard or any other suitable wireless networking standard. The network device 24 may allow the electronic device 8 to communicate over a network, such as a Local Area Network (LAN), Wide Area Network (WAN), or the Internet. Further, the electronic device 8 may connect to and send or receive data with any device on the network, such as portable electronic devices, personal computers, printers, and so forth. Alternatively, in some embodiments, the electronic device 8 may not include a network device 24. In such an embodiment, a NIC may be added as an expansion card 22 to provide similar networking capability as described above.

Further, the components may also include a power source 26. In one embodiment, the power source 26 may be one or more batteries, such as a lithium-ion polymer battery or other type of suitable battery. The battery may be user-removable or may be secured within the housing of the electronic device 8, and may be rechargeable. Additionally, the power source 26 may include AC power, such as provided by an electrical outlet, and the electronic device 8 may be connected to the power source 26 via a power adapter. This power adapter may also be used to recharge one or more batteries if present.

With the foregoing in mind, FIG. 2 illustrates an electronic device 8 in the form of a handheld device 30, here a cellular telephone. It should be noted that while the depicted handheld device 30 is provided in the context of a cellular telephone, other types of handheld devices (e.g., such as media players for playing music and/or video, personal data organizers, handheld game platforms, and/or combinations of such devices) may also be suitably provided as the electronic device 8. Further, a suitable handheld device 30 may incorporate the functionality of one or more types of devices, such as a media player, a cellular phone, a gaming platform, a personal data organizer, and so forth.

For example, in the depicted embodiment, the handheld device 30 is in the form of a cellular telephone that may provide various additional functionalities (such as the ability to take pictures, record audio and/or video, listen to music, play games, and so forth). As discussed with respect to the general electronic device of FIG. 1, the handheld device 30 may allow a user to connect to and communicate through the Internet or through other networks, such as LANs or WANs. The handheld electronic device 30, may also communicate with other devices using short-range connections, such as Bluetooth and near field communication. By way of example, the handheld device 30 may be a model of an iPod® or iPhone® available from Apple Inc. of Cupertino, Calif.

In the depicted embodiment, the handheld device 30 includes an enclosure or body that protects the interior components from physical damage and shields them from electromagnetic interference. The enclosure may be formed from any suitable material such as plastic, metal or a composite material and may allow certain frequencies of electromagnetic radiation to pass through to wireless communication circuitry within the handheld device 30 to facilitate wireless communication.

In the depicted embodiment, the enclosure includes user input structures 14 through which a user may interface with the device. Each user input structure 14 may be configured to help control a device function when actuated. For example, in a cellular telephone implementation, one or more of the input structures 14 may be configured to invoke a "home" screen or menu to be displayed, to toggle between a sleep and a wake mode, to silence a ringer for a cell phone application, to increase or decrease a volume output, and so forth.

In the depicted embodiment, the handheld device 30 includes a display 10 in the form of an organic light emitting diode (OLED) display 32. The OLED 32 may be used to display a graphical user interface (GUI) 34 that allows a user to interact with the handheld device 30. The GUI 34 may include various layers, windows, screens, templates, or other graphical elements that may be displayed in all, or a portion, of the display 10. Generally, the GUI 34 may include graphical elements that represent applications and functions of the handheld device 30. The graphical elements may include icons 36 and other images representing buttons, sliders, menu bars, and the like. The icons 36 may correspond to various applications of the handheld device 30 that may open upon selection of a respective icon 36. Furthermore, selection of an icon 36 may lead to a hierarchical navigation process, such that selection of an icon 36 leads to a screen that includes one or more additional icons or other GUI elements. The icons 36 may be selected via a touch screen included in the display 10, or may be selected by a user input structure 14, such as a wheel or button.

The handheld electronic device 30 also may include various input and output (I/O) ports 12 that allow connection of the handheld device 30 to external devices. For example, one I/O port 12 may be a port that allows the transmission and reception of data or commands between the handheld electronic device 30 and another electronic device, such as a computer. Such an I/O port 12 may be a proprietary port from Apple Inc. or may be an open standard I/O port.

In addition to handheld devices 30, such as the depicted cellular telephone of FIG. 2, an electronic device 8 may also take the form of a computer or other type of electronic device. Such computers may include computers that are generally portable (such as laptop, notebook, and tablet computers) as well as computers that are generally used in one place (such as conventional desktop computers, workstations and/or servers). In certain embodiments, the electronic device 8 in the form of a computer may be a model of a MacBook®, MacBook® Pro, MacBook Air®, iMac®, Mac® mini, Mac Pro®, or iPad® available from Apple Inc. By way of example, an electronic device 8 in the form of a laptop computer 50 is illustrated in FIG. 3 in accordance with one embodiment. The depicted computer 50 includes a housing 52, a display 10 (such as the depicted OLED 32), input structures 14, and input/output ports 12.

In one embodiment, the input structures 14 (such as a keyboard and/or touchpad) may be used to interact with the computer 50, such as to start, control, or operate a GUI or applications running on the computer 50. For example, a keyboard and/or touchpad may allow a user to navigate a user interface or application interface displayed on the display 10.

As depicted, the electronic device 8 in the form of computer 50 may also include various input and output ports 12 to allow connection of additional devices. For example, the computer 50 may include an I/O port 12, such as a USB port or other port, suitable for connecting to another electronic device, a projector, a supplemental display, and so forth. In addition, the computer 50 may include network connectivity, memory, and storage capabilities, as described with respect to FIG. 1. As a result, the computer 50 may store and execute a GUI and other applications.

It should be noted that the electronic device 8 having the presently disclosed display 10 may include devices other than those discussed as examples. Further, the electronic device may also include any device having a display 10 such as a television, a stand-alone display device, and so forth.

Figure 4:
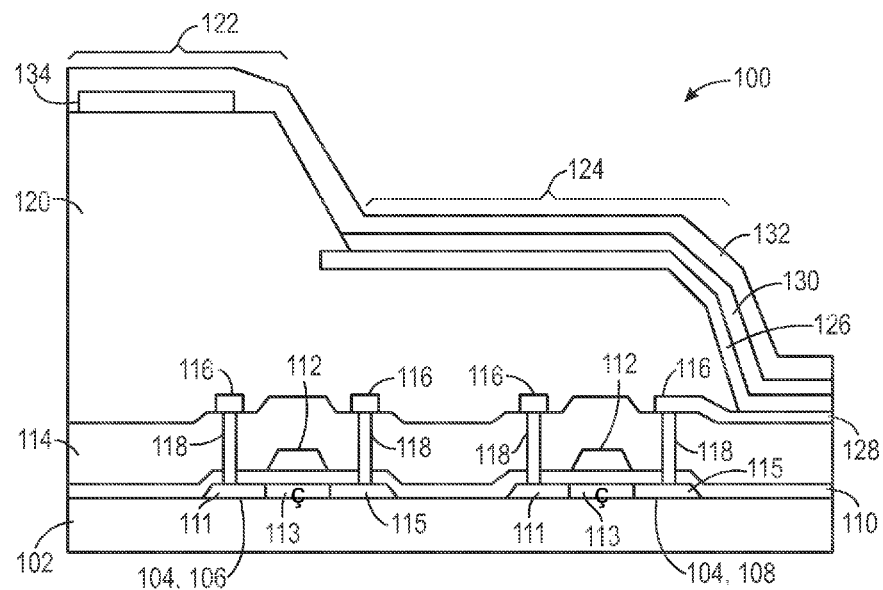
FIG. 4 is a cross-sectional view of a portion of a display, in accordance with aspects of the present disclosure.

FIG. 4 illustrates a cross-sectional view of a pixel area 100 of the display 10. The display 10 may be formed from several layers and components. Specifically, the display 10 includes a backplane 102, and one or more thin-film transistors (TFTs) 104 disposed on the backplane 102. In certain embodiments, such as the embodiment illustrated in FIG. 4, the display 10 may include a circuit switching TFT 106 as well as a driving TFT 108. In other embodiments, the display 10 may include more than one circuit switching TFTs 106 and/or driving TFTs 108. In certain embodiments, a gate insulator layer 110 is disposed over a source 111, a channel 113, and a drain 115 of the TFTs 104 and backplane 102 as shown. The gate insulator 110 insulates the channel 113 of each TFT 104 from a gate electrode 112 of each TFT 104.

As illustrated, the gate electrode 112 of each TFT 104 is positioned over the gate insulator layer 110 of each TFT 104 to form the gates of the TFTs 104. An interlayer dielectric (ILD) 114 is disposed over the gate electrodes 112 and the gate insulator layer 110. One or more contacts 116 are disposed over the ILD 114 and coupled to the source 111 and drain 115 of the TFTs 104 via respective vias 118 extending through the ILD 114 and the gate insulator layer 110. An insulating layer 120, such as an organic planarization layer, is disposed on the ILD 114 and the contacts 116. As illustrated, the insulating layer 120 may have different thicknesses at different areas. For example, in the illustrated embodiment, the insulating layer 120 is thicker near the switch TFT 106 than near the driving TFT 108. Thus, the insulating layer 120 forms an upper portion 122 and a lower portion 124.

A pixel electrode 126 is disposed along the lower portion 124 of the insulating layer 120 and adjacent to the upper portion 122 of the insulating layer 120. As illustrated, the pixel electrode 126 may be conductively coupled to the driving TFT 108 by one of the contacts 116 and a lead 128. An organic light emitting diode (OLED) layer 130 is disposed directly over the pixel electrode 126. The OLED layer 130 may emit light in response to an electric current flowing through the OLED layer 130. Specifically, the OLED layer 130 may emit light when there is current flowing between the pixel electrode 126 and a top electrode 132 (e.g., through the OLED layer 130). The top electrode 132 is generally disposed over the OLED layer 130 and the upper portion 122 of the insulating layer 120 that was not covered by the pixel electrode 126 or the OLED layer 130. The top electrode 132 is generally made of a transparent material which transmits the light emitted from the OLED layer 130. Thus, in the present embodiment, the display 10 may be a top emission display 10. Additionally, a metal frame 134 is disposed between the upper portion 122 of the insulating layer 120 and the top electrode 132. The metal frame 134, which may be made of a low resistance material (e.g., substantially conductive material), may be conductively coupled to the top electrode 132 such that the resistance level of the top electrode 132 is decreased by the low resistance of the metal frame 134.

Figure 5:
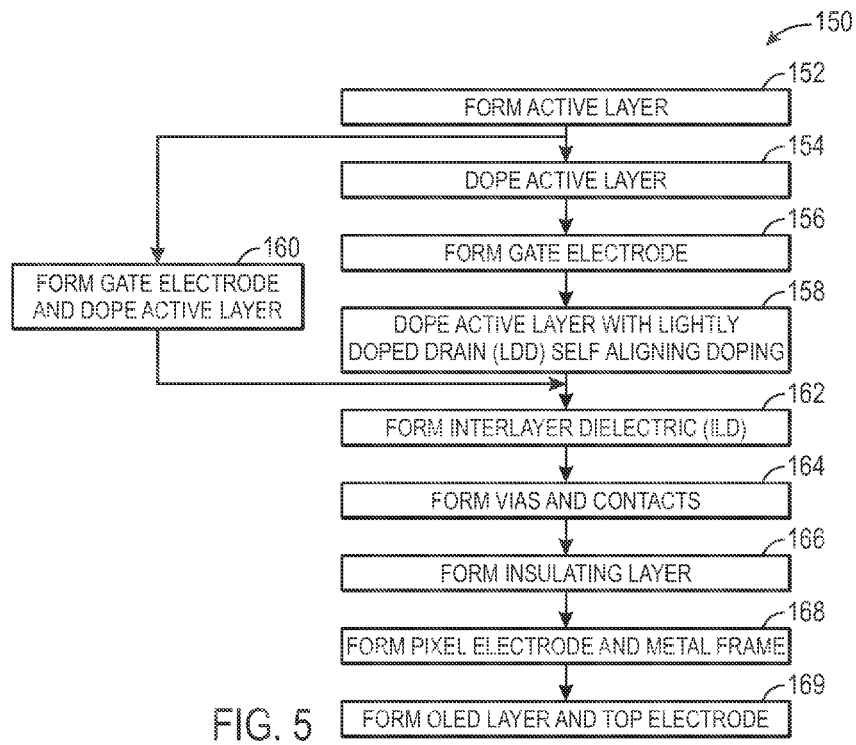

As mentioned previously, the present disclosure also provides a simplified process of making the abovementioned display 10. FIG. 5 illustrates a flowchart of a manufacturing process for forming the display 10. FIGS. 6A-9 illustrate portions of the manufacturing process for forming the display 10. Accordingly, FIGS. 6A-9 will be discussed concurrently with FIG. 5 to give visual descriptions of the manufacturing process described in the flowchart of FIG. 5. Referring now to FIG. 5, a manufacturing process 150 for forming the display 10 may include forming an active layer (block 152) over the backplane 102. In certain embodiments, the gate insulator 110 may be formed over the active layer.

Figure 6A:
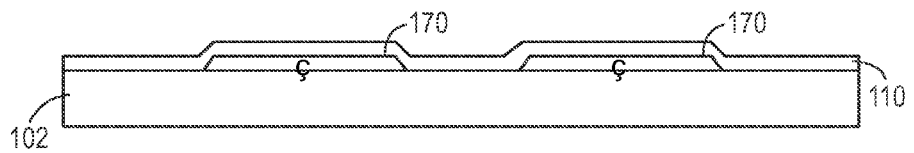
FIGS. 6A-6C illustrate portions of the manufacturing process described in the flowchart of FIG. 5, in accordance with aspects of the present disclosure.
Figure 6B:
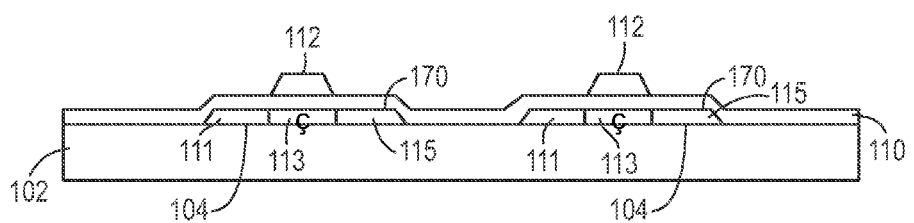

Accordingly, FIG. 6A illustrates an active layer 170 formed over the backplane 102. As may be appreciated, in certain embodiments, the active layer 170 may be formed over the backplane 102 then etched to the illustrated configuration. Furthermore, the gate insulator 110 may be formed over the active layer 170 and the backplane 102. The manufacturing process of FIG. 5 also includes doping the active layer 170 (block 154) and then forming the gate electrode 112 (block 156) on the gate insulator 110 over the active layer 170. In some embodiments, the active layer 170 may be doped (block 154) before the gate electrode 112 is formed (block 156). During such doping, the source 111, the channel 113, and the drain 115 of each TFT 104 are formed. Furthermore, after the gate electrode 112 is formed, a lightly doped drain (LDD) self aligning doping may be applied to the active layer 170 (block 158) to induce additional doping between the source and the channel, and between the drain and the channel, which may decrease TFT leakage current. In certain other embodiments, the gate electrode 112 may be formed and then the active layer 170 may be doped in the same step (block 160), using the gate electrode 112 to aid in a self align doping in order to form the source 111, the channel 113, and the drain 115 of each TFT 104. In such an embodiment, the LDD doping (block 158) may be skipped due to the circuit design, yet the doping may still decrease TFT leakage current. Accordingly, FIG. 6B illustrates the doped active layer 170 (having the source 111, the channel 113, and the drain 115) and gate electrodes 112. In certain embodiments, the active layer 170 may be doped with a P-type dopant, such as Boron, for example. Generally, these portions of the manufacturing process form the TFTs 104 in the display 10, such as the circuit switching TFT 106 and the driving TFT.

Figure 6C:
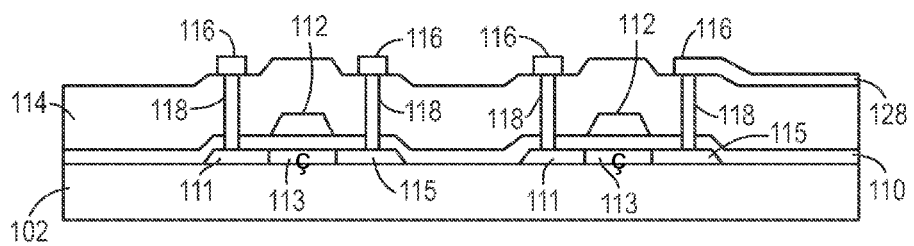
Figure 7:
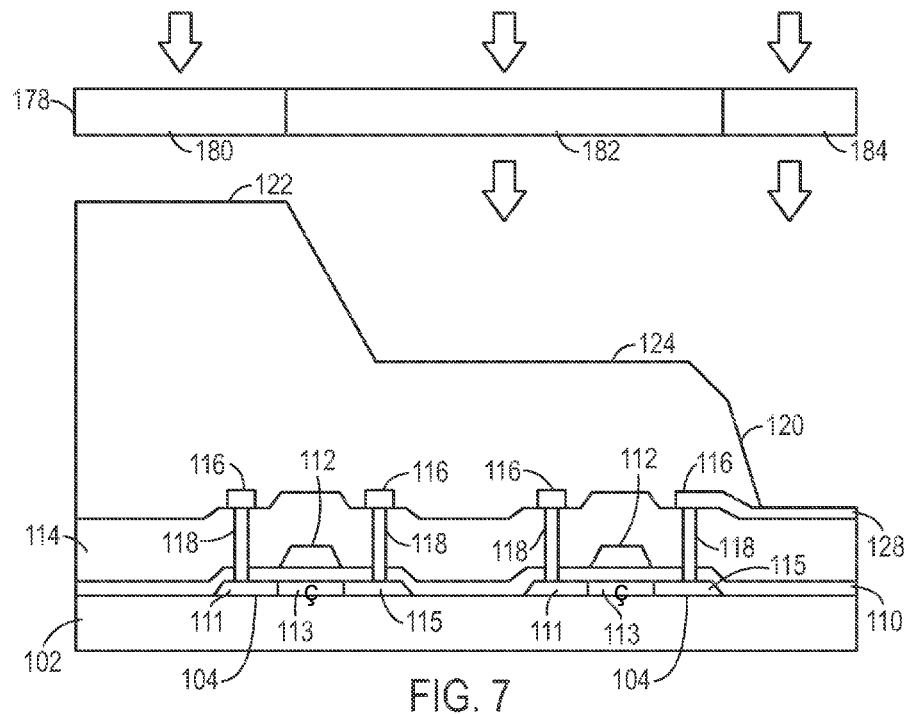
FIG. 7 illustrates a method of forming an insulating layer of the display using a graytone technique, in accordance with aspects of the present disclosure.

Returning to FIG. 5, the manufacturing process 150 also includes forming the ILD 114 (block 162). FIG. 6C shows the ILD 114 formed over the gate insulator layer 110 and the gate electrodes 112. The manufacturing process 150 of FIG. 5 may further include forming the vias 118 through the ILD 114 and the contacts 116 over the ILD 114, thereby establishing a conductive path between the contacts 116 and the TFTs 104 (block 164). Specifically, in certain embodiments, the contacts 116 may include source electrodes and drain electrodes which are coupled to respective sources 111 and drains 115 of the TFTs 104 via the vias 118 in the ILD 114. The vias 118 and the contacts 116 are illustrated in FIG. 6C and are respectively coupled to the source 111 and the drain 115 of each TFT 104. Additionally, the lead 128 may also be formed in conjunction with the vias 118 and the contacts 116. As previously discussed, the lead 128 may be configured to conductively couple the driving TFT 108 to the pixel electrode 126.

Further, the manufacturing process 150 of FIG. 5 may include forming the insulating layer 120 (block 166). Specifically, the insulating layer 120 may be a multi-level insulating layer 120, such as the insulating layer 120 illustrated in FIG. 7. In certain embodiments, the multi-level insulating layer 120 may be formed using a halftone or graytone mask, as further shown in FIG. 7. As may be appreciated, the insulating layer 120 may be made from photosensitive material that is removed though photolithography etching, in which designated portions of the material is removed when subjected to an intense light. In certain embodiments, the various thicknesses of the insulating layer 120 may be created in a single portion of the manufacturing process through the use of a halftone or graytone mask 178.

By varying the transmittance of the mask 178, the insulating layer 120 may be exposed to different light intensity, which may result in the removal of different amount of the insulating layer 120. For example, in areas where the mask 178 is dark 180 such as in the upper portion 122, less light or less intense light (e.g., low transmittance) reaches the insulating layer 120, which allows more material to remain, and the insulating layer 120 may be thicker, as shown. Likewise, in areas where the mask 178 is lighter 182, such as with the use of a gray tone, more light or more intense light (e.g., medium transmittance) may reach the insulating layer 120, and more of the insulating layer 120 material may be removed through photolithography etching. Thus, the insulating layer 120 may be made thinner as less material remains, such as in the lower portion 124.

Furthermore, the area where the mask 178 is generally transparent 184 allows most of the light through the mask 178 (e.g., high transmittance). This may remove all of the insulating layer 120, as illustrated. Generally, if the mask 178 is darker, a greater amount of the insulating layer 120 may remain, and as the mask 178 gets light, less of the insulating layer 120 material remains. Thus, the different thickness levels of the insulating layer 120 may all be made in a single portion of the manufacturing process by using an appropriately designed halftone or graytone mask 178.

Figure 8A:
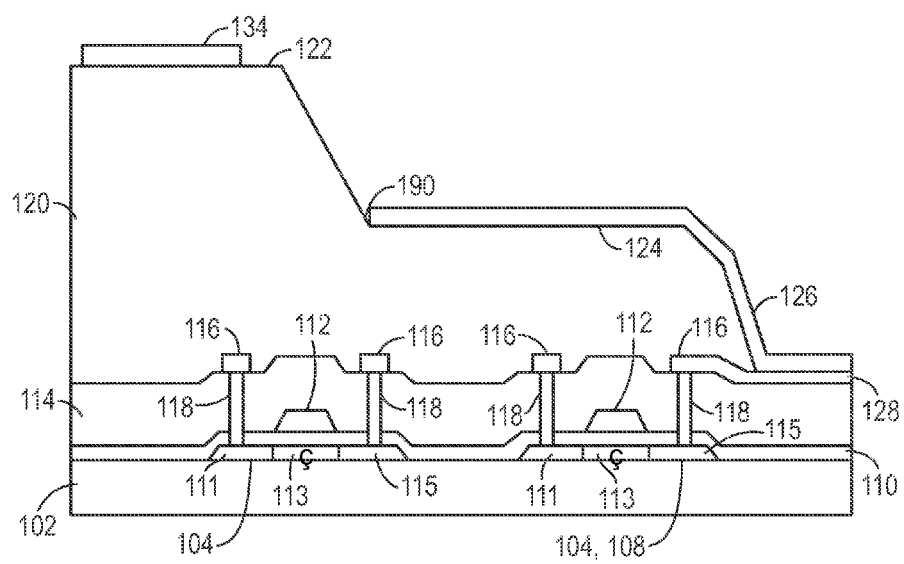
FIG. 8A illustrates portions of the manufacturing process described in the flowchart of FIG. 5, in accordance with aspects of the present disclosure.

Returning to FIG. 5, the manufacturing process 150 also includes forming the pixel electrode 126 and the metal frame 134 (block 168). Generally, the pixel electrode 126 and the metal frame 134 may be formed over certain portions of the insulating layer 120 during a single portion of the manufacturing process. FIG. 8A illustrates the display 10 after the pixel electrode 126 and the metal frame 134 are formed. Generally, the metal frame 134 may be formed on the upper portion 122 of the insulating layer 120 and the pixel electrode 126 may be formed on the lower portion 124 of the insulating layer 120. Furthermore, the pixel electrode 126 may be conductively coupled to the lead 128, thereby electrically connecting the pixel electrode 126 to the drain 115 of the driving TFT 108. Forming the pixel electrode 126 and the metal frame 134 in the same portion of the manufacturing process may simplify the manufacturing process.

Additionally, in some embodiments, the pixel electrode 126 and/or the insulating layer 120 may be subject to annealing after the pixel electrode 126 is formed over the insulating layer 120. In such an embodiment, the display 10 is heated to a high temperature. Accordingly, the insulating layer 120 may flow and cover the edge of the pixel electrode 126. Specifically, the insulating layer 120 may flow into a gap 190 between the pixel electrode 126 and the insulating layer 120. The resulting interaction between the insulating layer 120 and the pixel electrode 126 can be seen in FIG. 4 in which the gap 190 of FIG. 8A is removed. This flow of the insulating layer 120 that occurs through annealing may aid to reduce current leakage from the pixel electrode 126.

Figure 8B:
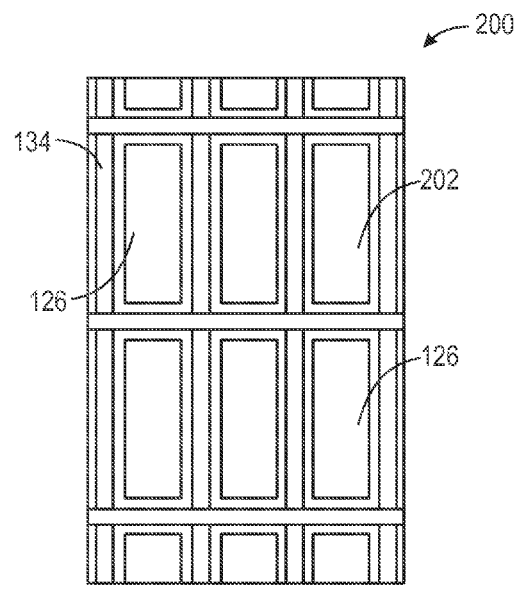
FIG. 8B is a top view of a pixel array of the display illustrated in FIG. 8A, in accordance with aspects of the present disclosure.

The metal frame 134 may form a rectangular structure around the pixel electrodes 126. Accordingly, FIG. 8B illustrates a top view of a portion of an array 200 of pixels 202 in the display 10. Each rectangle in the array 200 represents a pixel 202. As may be appreciated, the display 10 may include a much larger number of pixels 202 than shown. As shown, each pixel 202 includes the pixel electrode 126 bound by the metal frame 134, which forms a grid in the array 200.

Figure 9:
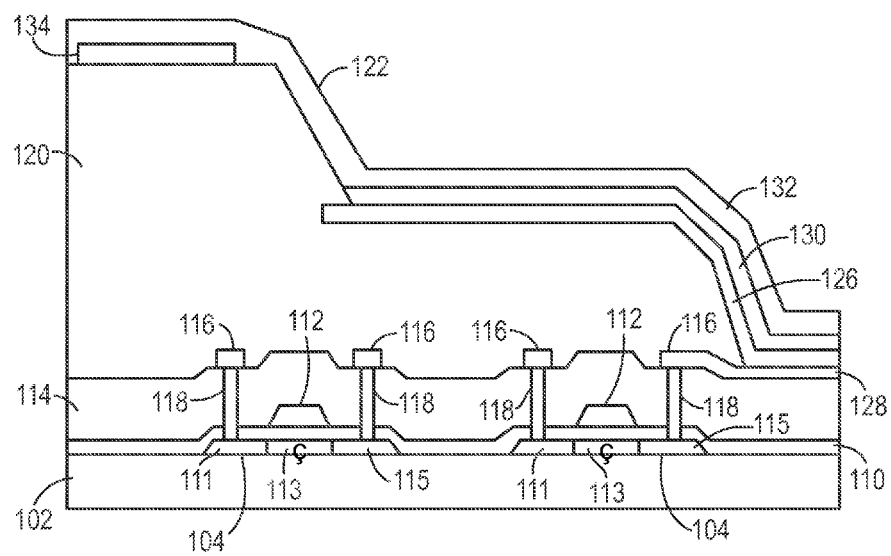
FIG. 9 illustrates portions of the manufacturing process described in the flowchart of FIG. 5, in accordance with aspects of the present disclosure.

Returning to the flowchart of FIG. 5, the manufacturing process 150 further includes forming the OLED layer 130 and the top electrode 132 (block 169). FIG. 9 shows that the OLED layer 130 is formed over the pixel electrode 126, and the top electrode 132 is formed over the metal frame 134, the insulating layer 120, and the OLED layer 130 of the display 10. The top electrode 132 is conductively coupled to the metal frame 134 to reduce the internal resistance of the top electrode 132.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A display comprising:
   a thin-film transistor (TFT) layer disposed over a backplane, wherein the TFT layer comprises one or more TFTs;
   an interlayer dielectric (ILD) disposed over the TFT layer, wherein the ILD comprises one or more vias;
   an insulating layer disposed over the ILD;
   a pixel electrode disposed over a first portion of the insulating layer, wherein the pixel electrode is coupled to at least one of the one or more TFTs by at least one of the one or more vias in the ILD;
   a metal frame layer disposed over a second portion of the insulating layer;
   an organic light emitting diode (OLED) layer disposed over the pixel electrode; and
   a top electrode disposed over the OLED layer and the metal frame layer, wherein the metal frame layer and the top electrode are conductively coupled together.

2. The display of claim 1, wherein the second portion of the insulating layer is thicker than the first portion of the insulating layer.

3. The display of claim 1, wherein the TFT layer comprises a circuit switching TFT and a driving TFT.

4. The display of claim 1, wherein insulating layer is annealed to cover an end of the pixel electrode.

5. The display of claim 1, comprising a gate insulating layer disposed between a gate of the one or more TFTs and a channel of the one or more TFTs.

6. The display of claim 1, wherein the metal frame forms a grid around one or more pixels in an array of pixels of the display.

7. An electronic device comprising:
   a display comprising:
      a pixel electrode disposed over a first portion of an insulating layer, wherein the pixel electrode is coupled to a thin-film transistor (TFT);
      a conductive layer disposed over a second portion of the insulating layer;
      an organic light emitting diode (OLED) layer disposed over the pixel electrode; and
      a top electrode disposed over the OLED layer and the conductive layer, wherein the conductive layer and the top electrode are conductively coupled together;
      wherein the display comprises a plurality of pixels each having a pixel electrode, and
   wherein the conductive layer forms a grid that surrounds each pixel electrode of the plurality of pixels.

8. The electronic device of claim 7, wherein the conductive layer extends along at least one edge of a pixel of the display.

9. The electronic device of claim 7, wherein the first portion of the insulating layer and the second portion of the insulating layer have different thicknesses.

10. A method, comprising:
    forming a thin-film transistor (TFT) layer over a backplane, wherein the TFT layer comprises one or more TFTs;
    forming an interlayer dielectric (ILD) over the TFT layer;
    forming one or more vias in the ILD;
    forming an insulating layer over the ILD;
    forming a pixel electrode over the insulating layer, wherein the pixel electrode is coupled to at least one of the one or more TFTs by at least one of the one or more vias in the ILD;
    forming a metal frame over the insulating layer;
    forming an organic light emitting diode (OLED) layer over the pixel electrode;
    forming a top electrode over the metal frame and OLED layer; and
    conductively coupling the metal frame layer and the top electrode.

11. The method of claim 10, comprising annealing the insulating layer to cause a portion of the insulating layer to flow over an edge of the pixel electrode.

12. The method of claim 10, comprising forming the insulating layer to have a first thickness between the metal frame and the ILD and a second thickness between the pixel electrode and the ILD, wherein the first thickness is greater than the second thickness.

13. The method of claim 10, wherein forming the insulating layer over the ILD comprises forming the insulating layer using a graytone mask so that the insulating layer comprises a varying thickness.

14. The method of claim 10, wherein the pixel electrode and the metal frame are formed together.

15. The method of claim 10, wherein the top electrode and the metal frame are conductively coupled together.

16. The method of claim 10, wherein forming the TFT comprises:
   forming an active layer;
   doping the active layer to form a doped active layer;
   forming a gate electrode over the doped active layer; and
   doping the doped active layer with lightly doped drain (LDD) self-aligning doping.

17. The method of claim 10, wherein forming the TFT comprises:
   forming an active layer;
   forming a gate electrode over the active layer; and
   doping the active layer after the gate electrode is formed.

18. An array of pixels for a display comprising:
   a plurality of conductive frames, wherein each pixel in the array of pixels is surrounded by one of the plurality of conductive frames;
   a plurality of top electrodes, wherein each pixel in the array of pixels comprises one of the plurality of top electrodes; and
   wherein at least one of the plurality of top electrodes is conductively coupled to one of the plurality of conductive frames.

19. The array of pixels of claim 18, wherein at least one pixel in the array of pixels comprises an organic light emitting diode (OLED) layer.

20. The array of pixels of claim 18, wherein at least one pixel in the array of pixels comprises a thin-film transistor (TFT).

21. The array of pixels of claim 18, wherein at least one pixel in the array of pixels comprises a pixel electrode.

22. The array of pixels of claim 18, wherein the display comprises a top emission active matrix organic light emitting diode (AMOLED) display.

23. A display comprising:
   a thin-film transistor (TFT) disposed over a backplane;
   a pixel electrode;
   a top electrode;
   an organic light emitting diode (OLED) layer disposed between the pixel electrode and the top electrode; and
   a low-resistance metal member disposed beneath the top electrode, wherein the metal member and the top electrode are conductively coupled together.

* * * * *